United States Patent [19]

Misak et al.

[11] Patent Number: 4,727,306
[45] Date of Patent: Feb. 23, 1988

[54] PORTABLE BATTERY CHARGER

[75] Inventors: Jeffrey P. Misak, Des Plaines; Steven F. Gillig, Roselle; Terrance J. Goedken, Schaumburg, all of Ill.

[73] Assignee: Motorola, Inc., Schaumburg, Ill.

[21] Appl. No.: 878,896

[22] Filed: Jun. 26, 1986

[51] Int. Cl.$^4$ .............................................. H02J 7/04
[52] U.S. Cl. ..................... 320/35; 320/20; 320/22; 320/31; 320/39; 320/48
[58] Field of Search ............... 320/20, 22, 23, 31, 320/35, 36, 39, 40, 48

[56] References Cited

U.S. PATENT DOCUMENTS

| 3,534,241 | 9/1968 | Wilson et al. | 320/33 |
| 3,667,026 | 5/1972 | Bogut et al. | 320/36 |
| 3,767,995 | 10/1973 | Kaminski et al. | 320/22 |
| 3,852,652 | 12/1974 | Jasinski | 320/35 |
| 3,917,990 | 11/1975 | Sherman, Jr. | 320/22 |
| 4,006,396 | 2/1977 | Bogut | 320/2 |
| 4,006,397 | 2/1977 | Catotti et al. | 320/31 |
| 4,061,956 | 12/1977 | Brown et al. | 320/39 |
| 4,213,081 | 7/1980 | Taylor | 320/40 |
| 4,311,952 | 1/1982 | Mabuchi et al. | 320/3 |
| 4,388,582 | 6/1983 | Saar et al. | 320/20 |
| 4,395,672 | 7/1983 | Gassaway | 320/31 |
| 4,468,605 | 8/1984 | Fitzgerald et al. | 320/36 |
| 4,649,333 | 3/1987 | Moore | 320/31 |

OTHER PUBLICATIONS

"Charging Nicads-Fast", Elektor, vol. 5, No. 12, Dec. 1979.

Primary Examiner—Patrick R. Salce
Assistant Examiner—Anita M. Ault
Attorney, Agent, or Firm—Rolland R. Hackbart

[57] ABSTRACT

A unique automatic battery charger (100) is described that recharges a battery (202) including a thermistor (206) for sensing the battery temperature. The charger (100) produces both a slow-charge current and a fast-charge current. Upon detecting the presence of the battery (202), the unique charger (100) turns on a fast-charge current produced by a switchable current source (110-113). The fast-charge current is subsequently turned off when the battery (202) is fully charged as indicated by the status of monitored temperature and voltage conditions. Comparators (180-184) are utilized to monitor these voltage and temperature conditions. According to a novel feature of the present invention, the monitored temperature thresholds are changed in response to the supply voltage. The automatic battery charging apparatus of the present invention may be advantageously utilized in a variety of applications for rapidly and safely charging batteries used in battery-operated electrical apparatus.

11 Claims, 2 Drawing Figures

PORTABLE BATTERY CHARGER

BACKGROUND OF THE INVENTION

The present invention is generally related to battery chargers and more particularly to an improved battery charger for rapidly and safely charging batteries in radio transceivers.

In the prior art, battery chargers have typically provided a relatively high charging current to a battery until the battery voltage reaches a predetermined voltage. Rapidly charging a battery, in particular nickel-cadmium batteries, may produce gas and high temperatures causing the battery to dry out and rupture or possibly explode. Therefore, chargers such as that shown and described in U.S. Pat. No. 3,767,995 (incorporated herein in its entirety by reference thereto) may also sense the temperature of a battery being charged and reduce the charging rate when the battery temperature rises above a predetermined temperature. However, such prior art battery chargers may still cause a battery to rupture or possibly explode if the battery is subjected to a charging current midway between the high-rate and low-rate charging currents due to low voltage or low current from the power supply.

SUMMARY OF THE INVENTION

Accordingly, it is an object of the present invention to provide improved automatic battery charging apparatus for rapidly and safely charging batteries.

It is another object of the present invention to provide improved automatic battery charging apparatus that is responsive to the charging current for varying the full-charge temperature threshold.

Briefly described, the present invention encompasses automatic battery charging apparatus for charging a battery from a supply voltage generated by a voltage source. The battery includes temperature sensing circuitry for generating an output signal having a magnitude related to the temperature of the battery. The unique automatic battery charging apparatus comprises: a first source coupled between the supply voltage and the battery for generating a first charging current; a second source coupled between the supply voltage and the battery for generating a second charging current in response to a first state of a control signal and disabling generation of the second charging current in response to a second state of the control signal, said second charging current having a magnitude greater than the first charging current; selecting circuitry responsive to the second charging current for selecting one of first and second thresholds; comparing circuitry for producing an output signal when the output signal of the temperature sensing circuitry exceeds said selected one of the first and second thresholds; and control circuitry for generating the first state of the control signal initially and the second state of the control signal in response to the output signal of the comparing circuitry, whereby the battery is protected from damage due to charging current and temperature.

DESCRIPTION OF THE PREFERRED EMBODIMENT

Figure 1A:
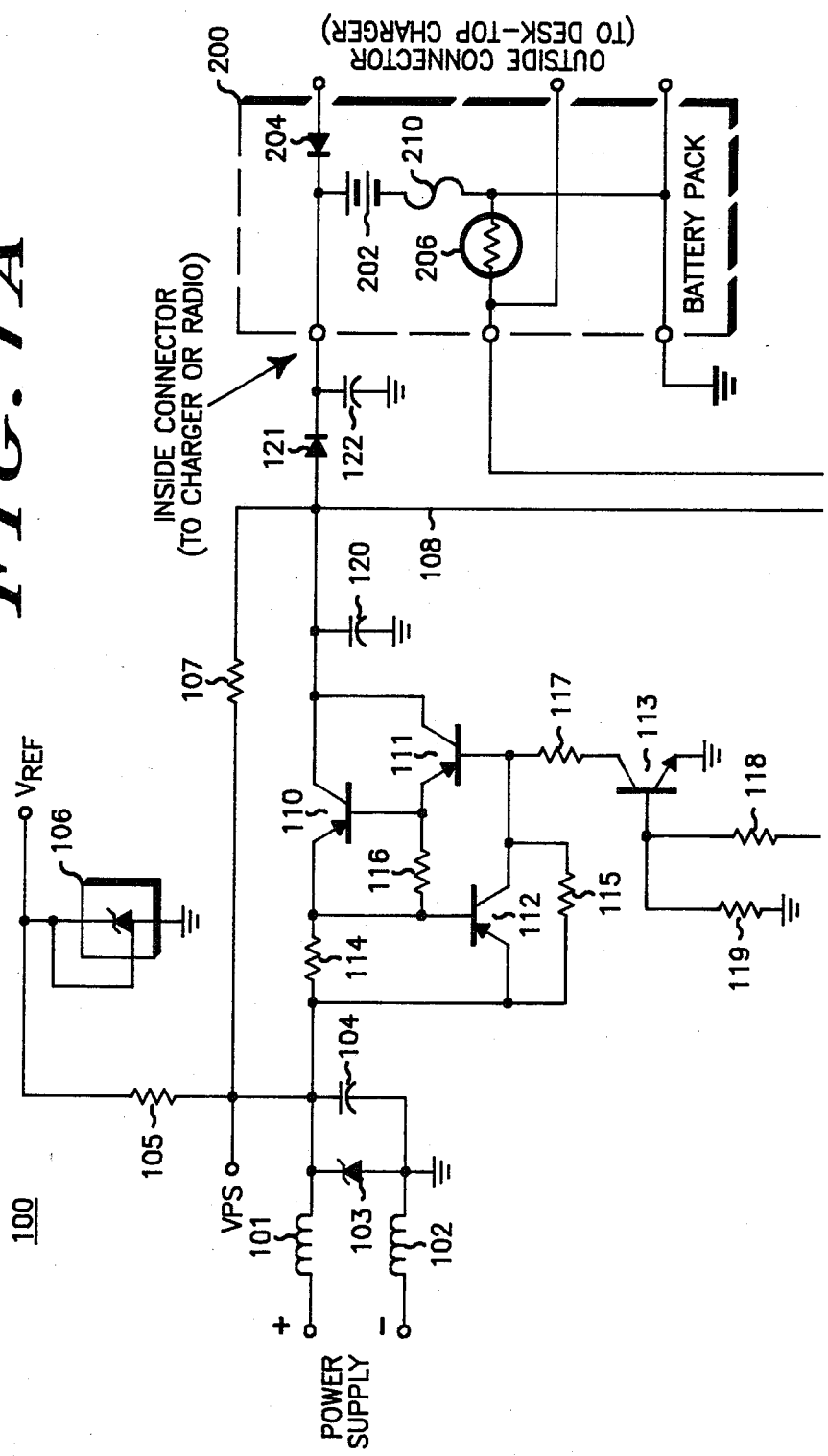
FIGS. 1A and 1B together are a detailed circuit diagram of a battery charger embodying the present invention together with a battery pack.
Figure 1B:
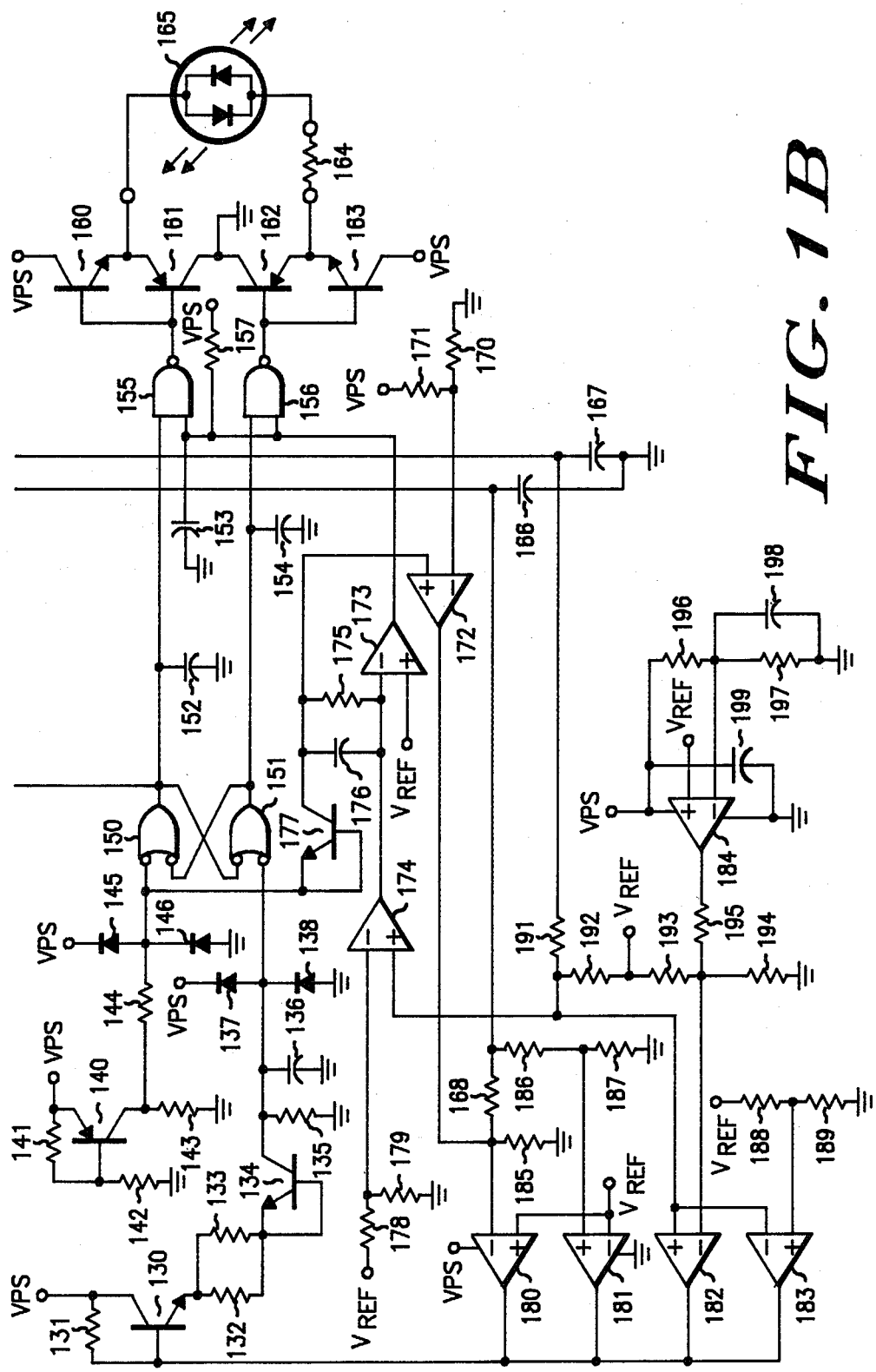

In FIGS. 1A and 1B, there is illustrated a detailed circuit diagram of a battery charger 100 embodying the present invention together with a battery pack 200. The unique automatic battery charger 100 recharges a battery 202 including a thermistor 206 for sensing the battery temperature. The charger 100 produces both a slow-charge current and a fast-charge current. A bi-color light emitting diode is green for the slow-charge mode and red for the fast-charge mode. Upon detecting the presence of battery pack 200, the unique charger 100 turns on a fast-charge current produced by a switchable current source 110-113. The fast-charge current is subsequently turned off when the battery 202 is fully charged as indicated by the status of monitored temperature and voltage conditions. According to a novel feature of the present invention, the monitored temperature thresholds are changed in response to the supply voltage $V_{ps}$.

Battery charger 100 may be coupled to a variety of power sources, such as a vehicle battery by way of a cigarette lighter adapter or a 120 VAC wall transformer, which produce the desired supply voltage $V_{ps}$. In the preferred embodiment, power supply voltage is specified at a nominal voltage of 13.6 VDC when sourcing 1 amp, and may vary from 10 VDC to 16.5 VDC at currents from 80 milliamps to 1 amp. Battery pack 200 is specified at 7.5 VDC and may be packaged as shown and described in the instant assignee's U.S. patent application Ser. No. 616,357, filed June 1, 1984, entitled "Battery or Similar Article", and invented by Michael I. Petrites for use in the radio transceiver shown and described in the instant assignee's U.S. Pat. No. Des. 269,873.

Battery pack 200 in FIG. 1A includes a rechargeable battery 202 that is preferably a conventional nickel-cadmium rechargeable battery. In order to facilitate rapid charging, battery pack 200 includes a thermistor 206 for sensing the temperature of battery 202. A fuse 210 is coupled in series with battery 202 for protecting battery 202 against short circuits. The plus and minus terminals for battery 202 and a terminal for thermistor 206 are coupled to both an inside connector (hidden from view when battery pack 200 is mounted in the radio transceiver) and an outside connector. The outside connector may be coupled to a desk-top battery charger without removing battery pack 200 from the radio transceiver. Since the outside connector is exposed, a reverse polarity diode 204 is coupled in series with battery 202 to prevent battery 202 from damage.

Rechargeable batteries 202, in particular conventional nickel-cadmium rechargeable batteries, are subject to damage if rapid charging is not carefully controlled. Rapidly charging a battery may produce gas and high temperatures causing the battery to dry out and rupture or possibly explode. Moreover, charging a battery at a rate midway between the high-rate and low-rate may also cause the battery to rupture or possibly explode. This mid-rate charging condition may be produced by low voltage or low current from the power supply. According to an important feature of the present invention, battery damage due to mid-rate charging is avoided by reducing the full-charge temperature threshold.

Referring to FIGS. 1A and 1B, battery charger 100 generally consists of two charging-current sources producing a fast-charge current of 1 amp and a slow-charge current of 50 milliamps and several battery-condition sensing circuits used to select between the fast-charge and slow-charge rates. In particular, charger 100 includes reference voltage source 106, slow-charge resistor 107, fast-charge transistors 110–113, bi-color mode-indicating light emitting diode (LED) 165, LED drive transistors 160–163, charge-control latch 150 and 151, battery-detecting comparator 174, and charge-control comparators 180–184.

Referring to FIG. 1A, the power supply is coupled by inductors 101 and 102 to reverse polarity diode 103 and filter capacitor 104 producing supply voltage $V_{ps}$. Supply voltage $V_{ps}$ is coupled by resistor 105 to reference voltage source 106, which may be a Texas Instruments type TL431 voltage regulator integrated circuit. In the preferred embodiment, reference voltage source 106 produces a 2.5 VDC reference voltage. Supply voltage $V_{ps}$ is also coupled by slow-charge resistor 107 to battery 202 via diode 121 for producing the slow-charge current. The fast-charge current is produced by fast-charge transistors 110–113. The fast-charge current is regulated by the emitter-base voltage of regulator transistor 112 across resistor 114. Whenever switching transistor 113 is turned on by a high voltage applied by gate 150 to resistors 118 and 119, transistors 110–112 are turned on via resistor 117 to produce the fast-charge current, and vice versa. The collectors of drive transistors 110 and 111 are coupled to filter capacitor 120 and by reverse-polarity diode 121 to filter capacitor 122.

Charge-control latch 150 and 151 in FIG. 1B switches the fast-charge current on and off by producing a high voltage or low voltage, respectively, at the output of gate 150. Gates 150, 151, 155 and 156 may be a Motorola type MC14011 logic integrated circuit. When power is applied to charger 100, transistor 140 and resistors 141–144 produce a high voltage at the input of gate 150 and capacitor 136 produces a low voltage at the input of gate 151, causing a low voltage at the output of gate 150. As a result the fast-charge current is turned off at power turn-on in the absence of battery pack 200. Diodes 145 and 146 and diodes 137 and 138 protect the inputs of gates 150 and 151, respectively, from being damaged due to static discharge.

In order to reduce the quiescent power consumption of battery charger 100 (25 milliamps maximum), most of the circuits are activated only when battery pack 200 is inserted into charger 100. Comparator 174 is utilized to detect the presence of battery pack 200 by detecting the presence of thermistor 206. The minus input of comparator 174 is biased at a level of approximately 2.4 VDC by resistor divider 178 and 179. Thermistor 206 is coupled to the plus input of comparator 174 by way of filter capacitor 167 and resistor 191. When battery pack 200 is not present, resistor 192 applies 2.5 VDC to the plus input causing open-collector comparator 174 to turn off. When comparator 174 turns off, signal ground is removed from the input of gate 150, and resistor 175, capacitor 176 and transistor 177 apply a high voltage to the minus input of comparator 173. When battery pack 200 is inserted into charger 100, a voltage divider is produced by resistors 191 and 192 and thermistor 206 which applies a voltage of less than 2.4 VDC to the plus input causing a low voltage at the output of comparator 174. The low voltage at the output of comparator 174 applies a momentary low voltage to the input of gate 150 and the plus input of comparator 172. The momentary low voltage to the input of gate 150 causes a high voltage at the output of gate 150. The momentary low voltage to the plus input of comparator 172 causes a momentary low voltage at the input of comparator 180 for preventing it from immediately shutting the fast-charge current off. The minus input of comparator 172 is biased at approximately two-thirds of supply voltage $V_{ps}$ by resistor divider 170 and 171. Thereafter, a high voltage is applied to the plus input of comparator 172 causing it to turn off. At the same time, the low voltage at the output of comparator 174 causes a high voltage at the output of comparator 173 which enables gates 155 and 156. Gates 155 and 156 apply the outputs of gates 150 and 151 to bi-color diode 165 by way of driver transistors 160–163. As a result, the fast-charge current is turned on and the red LED of bi-color LED 165 is turned on. When the fast-charge current is turned off, the green LED of bi-color LED 165 is turned on.

Once the battery pack 200 is inserted and the fast-charge current is turned on, open-collector comparators 180–184 monitor various aspects of battery pack 200 to determine if the fast-charge current should be turned off. Comparators 180–184 and 172–174 may be Motorola type MC3302 comparator integrated circuits. Comparator 180 monitors the battery voltage for over-voltage conditions. Comparator 181 monitors the battery voltage for under-voltage conditions. Comparators 182 and 184 monitor the battery for warm-battery conditions. Comparator 183 monitors the battery for cold-battery conditions. The outputs of comparators 180–183 are wire-ORed and coupled to transistor 130 and pull-up resistor 131. Transistor 130 applies the output of comparators 180–183 to the input of gate 151 by way of resistors 132 and 133, transistor 134, resistor 135 and capacitor 136. When one of comparators 180–183 produce a low voltage at its output, a low voltage is applied to gate 151 causing a low voltage at the output of gate 150 and turning off the fast-charge current.

Comparator 181 turns off the fast-charge current if voltage 108 is below approximately 5 VDC. This condition indicates that either battery 202 is deeply discharged or a short circuit may exist in battery pack 200. The 2.5 VDC reference voltage is applied to the minus input of comparator 181. Resistor divider 186 and 187 applies voltage 108 to the plus input of comparator 181. If voltage 108 falls below 5 VDC, a low voltage is produced at the output of comparator 181.

Comparator 180 turns off the fast-charge current if voltage 108 is above approximately 11 VDC. This condition indicates that either battery 202 is fully charged or an open circuit may exist in battery pack 200. The 2.5 VDC reference voltage is applied to the plus input of comparator 180. Resistor divider 168 and 185 applies voltage 108 to the minus input of comparator 180. If voltage 108 is greater than 11 VDC, a low voltage is produced at the output of comparator 180. Comparator 172 is used to momentarily inhibit comparator 180 when battery pack 200 is inserted into charger 100. Otherwise, comparator 180 may sense an overvoltage before the battery pack is fully seated in charger 100.

Comparator 182 turns off the fast-charge current if the battery temperature exceeds approximately 45° C. This condition indicates that battery 202 is fully charged or too warm and therefore may dry out and rupture or possibly explode if fast charged. When supply voltage $V_{ps}$ is greater than 11.4 VDC, a voltage of approximately 0.85 VDC is applied to the minus input of comparator 182 by the resistor divider formed by resistor 193 and the parallel combination of resistors 194 and 195. The voltage divider provided by resistors 191 and 192 and thermistor 206 applies a voltage less than 2.4 VDC to the plus input of comparator 182. If battery 202 has a temperature near 45° C., thermistor 206 has a resistance of approximately 4,400 Ohms. When placed in series with resistors 191 and 192, the 4,400 Ohms of thermistor 206 produces a voltage at the plus input of comparator 182 lower than 0.85 VDC. Thus, when battery 202 has a temperature near 45° C., a low voltage is produced at the output of comparator 182 causing the fast-charge current to turn off.

According to the present invention, when mid-rate charging is detected, the battery temperature threshold at which the fast-charge current is turned off is reduced from 45° C. to 35° C. If the battery is subjected to a charging current midway between the high-rate and low-rate charging currents due to low voltage or low current from the power supply, serious damage may result. The mid-rate charging condition may be detected by either monitoring the supply voltage $V_{ps}$ or the fast-charge current in order to detect a charging current midway between the high-rate and low-rate charging currents. This feature of the present invention is accomplished in the preferred embodiment by increasing the voltage applied to the minus input of comparator 182 when supply voltage $V_{ps}$ is less than 11.4 VDC. When supply voltage $V_{ps}$ is less than 11.4 VDC, the voltage produced by resistor divider 196 and 197 and capacitor 198 is lower than the 2.5 VDC reference voltage. This causes open-collector comparator 184 to turn off removing signal ground from resistor 195. Since resistor 195 is no longer in parallel with resistor 194, the voltage applied by resistor divider 193 and 194 to the minus input of comparator 182 is increased. As a result, the fast-charge turn-off threshold is reduced from 45° C. to 35° C., thereby protecting battery 202 from damage due to mid-rate charging. Prolonged mid-rate charging of battery 202 may produce gas and high temperatures causing the battery to dry out and rupture or possibly explode. By utilizing the present invention, prolonged mid-rate charging of a battery and the dangers associated therewith are avoided.

Comparator 183 turns off the fast-charge current if the battery temperature is below approximately 5° C. Resistor divider 188 and 189 apply a reference voltage to the plus input of comparator 183. The voltage divider produced by resistors 191 and 192 and thermistor 206 applies a voltage less than 2.4 VDC to the minus input of comparator 183. If battery 202 has a temperature near 5° C., thermistor 206 has a resistance of approximately 26,000 Ohms. When placed in series with resistors 191 and 192, the 26,000 Ohms of thermistor 206 produces a voltage at the minus input of comparator 183 greater than the voltage applied by resistor divider 188 and 189 to the plus input of comparator 183. This condition produces a low voltage at the output of comparator 183. Thus, when battery 202 has a temperature near 5° C., a low voltage is produced at the output of comparator 183 causing the fast-charge current to turn off.

In summary, unique automatic battery charging apparatus has been described that recharges a battery with either a slow-charge current or a fast-charge current. Upon detecting the presence of the the battery, the unique charger turns on the fast-charge current. The fast-charge current is subsequently turned off when the battery is fully charged as indicated by the status of monitored temperature and voltage conditions. According to a novel feature of the present invention, the monitored temperature thresholds are changed in response to the charging current. The automatic battery charging apparatus of the present invention may be advantageously utilized in a variety of applications for rapidly and safely charging batteries used in battery-operated electrical apparatus.

We claim:

1. Automatic battery charging apparatus for charging a battery from a supply voltage generated by a voltage source, said battery including temperature sensing means for generating a first output signal having a magnitude related to the temperature of the battery, said apparatus comprising:

first source means coupled between the supply voltage and the battery for generating a first charging current;

second source means coupled between the supply voltage and the battery for generating a second charging current in response to a first state of a control signal and disabling generation of the second charging current in response to a second state of the control signal, said second charging current having a magnitude greater than the first charging current;

means for generating a reference voltage;

selecting means responsive to the supply voltage for selecting one of first and second thresholds, said selecting means further including first means coupled to said reference voltage for producing the first threshold and second means coupled to said reference voltage and the supply voltage for producing the second threshold;

comparing means for producing a second output signal when the first output signal of the temperature sensing means exceeds said selected one of the first and second thresholds; and control means for generating the first state of the control signal initially and the second state of the control signal in response to the second output signal of the comparing means, whereby the battery is protected from damage due to charging current and temperature.

2. The automatic battery charging apparatus according to claim 1, further including means for visually indicating when said first charging current is being generated.

3. The automatic battery charging apparatus according to claim 1, wherein said control means includes memory means for storing the first and second states of the control signal.

4. The automatic battery charging apparatus according to claim 1, wherein said control means further includes means responsive to the presence of the battery for initially generating the first state of the control signal.

5. Automatic battery charging apparatus for charging a battery from a supply voltage generated by a voltage source, said battery including temperature sensing means for generating a first output signal having a magnitude related to the temperature of the battery, said apparatus comprising:

first source means coupled between the supply voltage and the battery for generating a first charging current;

second source means coupled between the supply voltage and the battery for generating a second charging current in response to a first state of a control signal and disabling generation of the second charging current in response to a second state of the control signal, said second charging current having a magnitude greater than the first charging current;

means for generating a reference voltage;

selecting means responsive to the supply voltage for selecting one of first and second high-temperature thresholds, said selecting means further including first means coupled to said reference voltage for producing the first high-temperature threshold and second means coupled to said reference voltage and the supply voltage for producing the second high-temperature threshold;

first comparing means for producing a second output signal when the first output signal of the temperature sensing means exceeds said selected one of the first and second high-temperature thresholds;

second comparing means for producing a third output signal when the first output signal of the temperature sensing means exceeds a low-temperature threshold;

third comparing means for producing a fourth output signal when the battery voltage is greater than a predetermined maximum voltage;

fourth comparing means for producing a fifth output signal when the battery voltage is less than a predetermined minimum voltage; and control means for generating the first state of the control signal initially and the second state of the control signal in response to one or more of the second, third, fourth and fifth output signals of the first, second, third and fourth comparing means, respectively, whereby the battery is protected from damage due to charging current and temperature.

6. The automatic battery charging apparatus according to claim 5, further including means for visually indicating when said first charging current is being generated.

7. The automatic battery charging apparatus according to claim 5, wherein said control means includes memory means for storing the first and second states of the control signal.

8. The automatic battery charging apparatus according to claim 5, wherein said control means further includes means responsive to the presence of the battery for initially generating the first state of the control signal.

9. A method for charging a battery from a supply voltage generated by a voltage source, said battery including temperature sensing means for generating an output signal having a magnitude related to the temperature of the battery, said method comprising the steps of:

coupling to the battery a first charging current produced by a first source means;

coupling to and decoupling from the battery a second charging current produced by second source means in response to first and second states of a control signal, respectively, said second charging current having a magnitude greater than the first charging current;

generating a reference voltage;

producing a first threshold from said reference voltage;

producing a second threshold from said reference voltage and the supply voltage;

selecting in response to the second charging current one of the first and second thresholds;

generating the first state of the control signal initially and the second state of the control signal when the output signal of the temperature sensing means exceeds said selected one of the first and second thresholds, whereby the battery is protected from damage due to charging current and temperature.

10. The method according to claim 9, wherein said generating step further includes the step of initially generating the first state of the control signal in response to the presence of the battery.

11. Automatic battery charging apparatus for charging a battery from a supply voltage generated by a voltage source, said battery including temperature sensing means for generating an output signal having a magnitude related to the temperature of the battery, said apparatus comprising:

means for coupling to the battery a first charging current produced by first source means;

means for coupling to and decoupling from the battery a second charging current produced by second source means in response to first and second states of a control signal, respectively, said second charging current having a magnitude greater than the first charging current;

means for generating a reference voltage;

means for selecting in response to the supply voltage one of first and second thresholds, said selecting means further including first means coupled to said reference voltage for producing the first threshold and second means coupled to said reference voltage and the supply voltage for producing the second threshold;

means for generating the first state of the control signal initially and the second state of the control signal when the output signal of the temperature sensing means exceeds said selected one of the first and second thresholds, whereby the battery is protected from damage due to charging current and temperature.

* * * * *